US009406251B2

(12) United States Patent
Shao et al.

(10) Patent No.: US 9,406,251 B2
(45) Date of Patent: Aug. 2, 2016

(54) DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xianjie Shao, Beijing (CN); Xiaohe Li, Beijing (CN)

(73) Assignees: BOE Technology Group Co., Ltd., Beijing (CN); HEFEI BOE Optoelectronics Technology Co., Ltd., Hefei (CN)

( * ) Notice: Subject to any disclaimer, the term of this patent is extended or adjusted under 35 U.S.C. 154(b) by 99 days.

(21) Appl. No.: 14/366,236

(22) PCT Filed: Jun. 4, 2013

(86) PCT No.: PCT/CN2013/076710
§ 371 (c)(1),
(2) Date: Jun. 17, 2014

(87) PCT Pub. No.: WO2014/161226
PCT Pub. Date: Oct. 9, 2014

(65) Prior Publication Data
US 2015/0325158 A1    Nov. 12, 2015

(30) Foreign Application Priority Data

Apr. 1, 2013  (CN) .......................... 2013 1 0111159

(51) Int. Cl.
G09G 3/00    (2006.01)
G01R 31/00   (2006.01)
(Continued)

(52) U.S. Cl.
CPC .............. *G09G 3/006* (2013.01); *G01R 31/025* (2013.01); *G01R 31/2884* (2013.01); *G02F 1/13452* (2013.01); *G02F 1/136286* (2013.01); *G02F 2001/133388* (2013.01); *G02F 2001/136254* (2013.01)

(58) Field of Classification Search
CPC .............. G02F 1/136286; G02F 2001/133388; G02F 1/13452; G02F 2001/136254; G02F 1/136204; G02F 1/136213; G02F 1/136259; G09G 3/006; G09G 3/3648
USPC .................. 324/750.3, 760.01, 760.02, 76.11
See application file for complete search history.

(56) References Cited

U.S. PATENT DOCUMENTS 5,994,916 A *  11/1999  Hayashi ................ G02F 1/1309
                                                    324/500
6,624,857 B1    9/2003  Nagata et al.
(Continued)

OTHER PUBLICATIONS

The State Intellectual Property Office of the People's Republic of China ("SIPO") (Chinese language) second office action issued on Jan. 15, 2015 by SIPO in Chinese Patent Application 201310111159. 6. Six (6) pages.

(Continued)

*Primary Examiner* — Vincent Q Nguyen
(74) *Attorney, Agent, or Firm* — Banner & Witcoff, Ltd.

(57) ABSTRACT

A display panel and a display device comprising a pixel area (A) and a peripheral wiring area, wherein detection switches are arranged between the pixel area (A) and the peripheral wiring area, the detection switches correspond to gate lines (11) and/or data lines (10) of the pixel area (A) one to one, and the detection switches are configured to control connection and disconnection of the pixel area (A) and the peripheral wiring area. In the display panel, it is possible to precisely and quickly detect whether there is a short-circuit or open-circuit defect and the precise position of the defect. It is only required to perform an inching detection on signal lines in a small area during the detection procedure, which saves detection time and improves detection efficiency.

12 Claims, 3 Drawing Sheets

(51) Int. Cl.
  *G01R 31/28*  (2006.01)
  *G01R 31/02*  (2006.01)
  *G02F 1/1345*  (2006.01)
  *G02F 1/1362*  (2006.01)
  *G02F 1/1333*  (2006.01)

(56) References Cited

U.S. PATENT DOCUMENTS 7,129,923 B2 * 10/2006 Lu ..................... G09G 3/3648
                                                           324/527

2010/0097538 A1 * 4/2010 Ota ................... G02F 1/136204
                                                          349/48

OTHER PUBLICATIONS

English Translation of the State Intellectual Property Office of the People's Republic of China ("SIPO") (Chinese language) second office action issued on Jan. 15, 2015 by SIPO in Chinese Patent Application 201310111159.6. Four (4) pages.

Oct. 6, 2015—International Preliminary Report on Patentability Appn PCTCN2013076710.

* cited by examiner

DISPLAY PANEL AND DISPLAY DEVICE

CROSS REFERENCE TO RELATED APPLICATIONS

This application is based on International Application No. PCT/CN2013/076710 filed on Jun. 4, 2013, which claims priority to Chinese National Application No. 201310111159.6 filed on Apr. 1, 2013. The entire contents of each and every foregoing application are incorporated herein by reference.

TECHNICAL FIELD OF THE DISCLOSURE

The present disclosure relates to a display panel, and in particular, to a display panel capable of detecting short-circuit defects.

BACKGROUND

Display panels are more and more acceptable by people due to its advantages such as low voltage, small radiation, light weight, small volume and so on. However, for designers and manufacturers of display panels, it is desired to fabricate the products with high quality, low cost and less defect.

Peripheral circuits of a display panel usually need to be optimized in terms of their paths due to necessity of saving space or other factors. No matter how the peripheral circuit changes, two parts are necessary for a display panel. One part is a peripheral wiring area connecting an integrated circuit (IC) and a pixel area, which functions to transfer a signal output from the IC to the pixel area to make the display panel display pictures normally. The other part is the pixel area for displaying the picture area. As long as either part of the two parts is open-circuited or short-circuited, a linear defect would occur in the display of the display panel. Maintenance staff needs to search for the defect point to fix it by moving from the IC through to the end of the pixel area along the linear defect in an inching manner. However, the prior art search method for a defect point has limited speed, which increases labor cost dramatically and wastes the throughput. Low time search easily causes fatigue of the maintainer and reduces the efficiency of searching for the defect point. With development of the process and the demand of the market, now the display panel develops towards the direction of narrowness, thinness and lightness, which puts stricter and stricter demand on the internal circuit of the panel. In order to implement a narrow bezel, the wiring lines need to be as thin as possible, and the spacing therebetween needs to be as small as possible. As the wiring lines become thinner and the spacing becomes smaller, the possibility of short circuit and open circuit occurring in the inner of the panel increases. In this case, it is very important to position and fix the short circuit and the open circuit. There have been many solutions for the open circuit. However, there are few solutions for determining the short-circuit defect.

SUMMARY

An embodiment of the present disclosure provides a display panel. It is possible to precisely and quickly detect whether there are short-circuit or open-circuit defects and to locate the precise positions of the defects.

To this end, an embodiment of the present disclosure provides a display panel comprising a pixel area and a peripheral wiring area, wherein a plurality of detection switches are arranged between the pixel area and the peripheral wiring area, the detection switches correspond to gate lines and/or data lines of the pixel area one to one, and the detection switches are configured to control connection and disconnection of the pixel area and the peripheral wiring area.

Optionally, each detection switch comprise a first thin film transistor (TFT), wherein the peripheral wiring area is a gate line wiring area, the gate of the first TFT is connected with a first external connection signal, the source of the first TFT is connected with a signal line of the gate line wiring area, and the drain of the first TFT is connected with the gate line of the pixel area.

Optionally, the display panel further comprises a plurality of third TFTs and a plurality of fourth TFT arranged on one side of the display panel opposite to the first TFT, wherein the gate of each third TFT is connected with an evaluation indication signal terminal, the source of each third TFT is connected with a third external connection signal line, the drain of each third TFT is connected with an odd-numbered row of gate line, the gate of each fourth TFT is connected with the evaluation indication signal terminal, the source of each fourth TFT is connected with a fourth external connection signal line, and the drain of each fourth TFT is connected with an even-numbered row of gate line.

Optionally, each detection switch comprises a second TFT, wherein the peripheral wiring area is a data line wiring area, the gate of the second TFT is connected with a second external connection signal, the source of the second TFT is connected with a signal line of the data line wiring area, and the drain of the second TFT is connected with the data line of the pixel area.

Optionally, the display panel further comprises a plurality of fifth TFTs and a plurality of sixth TFTs arranged on one side of the display panel opposite to the second TFT, wherein the gate of each fifth TFT is connected with an evaluation indication signal terminal, the source of each fifth TFT is connected with a fifth external connection signal line, the drain of each fifth TFT is connected with an odd-numbered column of data line, the gate of each sixth TFT is connected with the evaluation indication signal terminal, the source of each sixth TFT is connected with a sixth external connection signal line, and the drain of each sixth TFT is connected with an even-numbered column of data line.

Optionally, each detection switch comprises a first TFT and a second TFT, and the peripheral wiring area comprises a gate line wiring area and data line wiring area; the gate of the first TFT is connected with a first external connection signal, the source of the first TFT is connected with a signal line of the gate line wiring area, and the drain of the first TFT is connected with the gate line of the pixel area; and the gate of the second TFT is connected with a second external connection signal, the source of the second TFT is connected with a signal line of the data line wiring area, and the drain of the second TFT is connected with the data line of the pixel area.

Optionally, the display panel further comprises a plurality of third TFTs and a plurality of fourth TFT arranged on one side of the display panel opposite to the first TFT, and a plurality of fifth TFTs and a plurality of sixth TFTs arranged on one side of the display panel opposite to the second TFT, wherein the gate of each third TFT is connected with an evaluation indication signal terminal, the source of each third TFT is connected with a third external connection signal line, the drain of each third TFT is connected with an odd-numbered row of gate line; the gate of each fourth TFT is connected with the evaluation indication signal terminal, the source of each fourth TFT is connected with a fourth external connection signal line, and the drain of each fourth TFT is connected with an even-numbered row of gate line; the gate of each fifth TFT is connected with the evaluation indication signal terminal, the source of each fifth TFT is connected with a fifth external connection signal line, the drain of each fifth TFT is connected with an odd-numbered column of data line, the gate of each sixth TFT is connected with the evaluation indication signal terminal, the source of each sixth TFT is connected with a sixth external connection signal line, and the drain of each sixth TFT is connected with an even-numbered column of data line.

An embodiment of the present disclosure also provides a display device comprising the above display panel.

In the display panel provided by an embodiment of the present disclosure, the connection and disconnection between the pixel area and the peripheral wiring area are controlled by arranging detection switches between the pixel area and the peripheral wiring area, and it is determined whether there exist open-circuit/short-circuit defects and the precise positions of the defects by observing the display of the odd-numbered row/column of the pixels and its adjacent even-numbered row/column of the pixels under the connection and the disconnection.

BRIEF DESCRIPTION OF THE DRAWINGS

The following description in connection with drawings makes it easier to understand embodiments of the present disclosure and understand the advantages and features accompanying them, in which.

DETAILED DESCRIPTION

In order to make contents of embodiments of the present disclosure clearer and easily understood, detailed description is made on specific embodiments of the present disclosure in connection with the drawings in the following. In embodiments of the present disclosure, the display panels provided by embodiments of the present disclosure are described by examples; however, the present disclosure is not limited to specific forms of the disclosed specific embodiments. Those skilled in the art can make modifications and variations to the embodiments of the present disclosure based on the content disclosed by the embodiments of the present disclosure, and those modifications and variations are also supposed to fall in the protection scope of the present disclosure defined by the claims.

A display panel provided by an embodiment of the present disclosure comprises a pixel area and a peripheral wiring area. Detection switches are arranged between the pixel area and the peripheral wiring area, the detection switches are corresponding to gate lines of the pixel area one to one, and the detection switches are configured to control connection and disconnection of the pixel area and the peripheral wiring area.

In particular, the detection switch comprise a first thin film transistor (TFT), the gate of the first TFT is connected with a first external connection signal, the source of the first TFT is connected with a signal line of the gate line wiring area, and the drain of the first TFT is connected with the gate line of the pixel area.

Since the source and the drain of the switch transistor adopted herein are symmetrical, the source and the drain are exchangeable. In embodiments of the present disclosure, in order to distinguish the two electrodes other than the gate of the transistor, one of the two electrodes is referred to as the source, and the other is referred to as the drain. If the source is selected as the signal input terminal, the drain is as the signal output terminal, vice versa.

Figure 1:
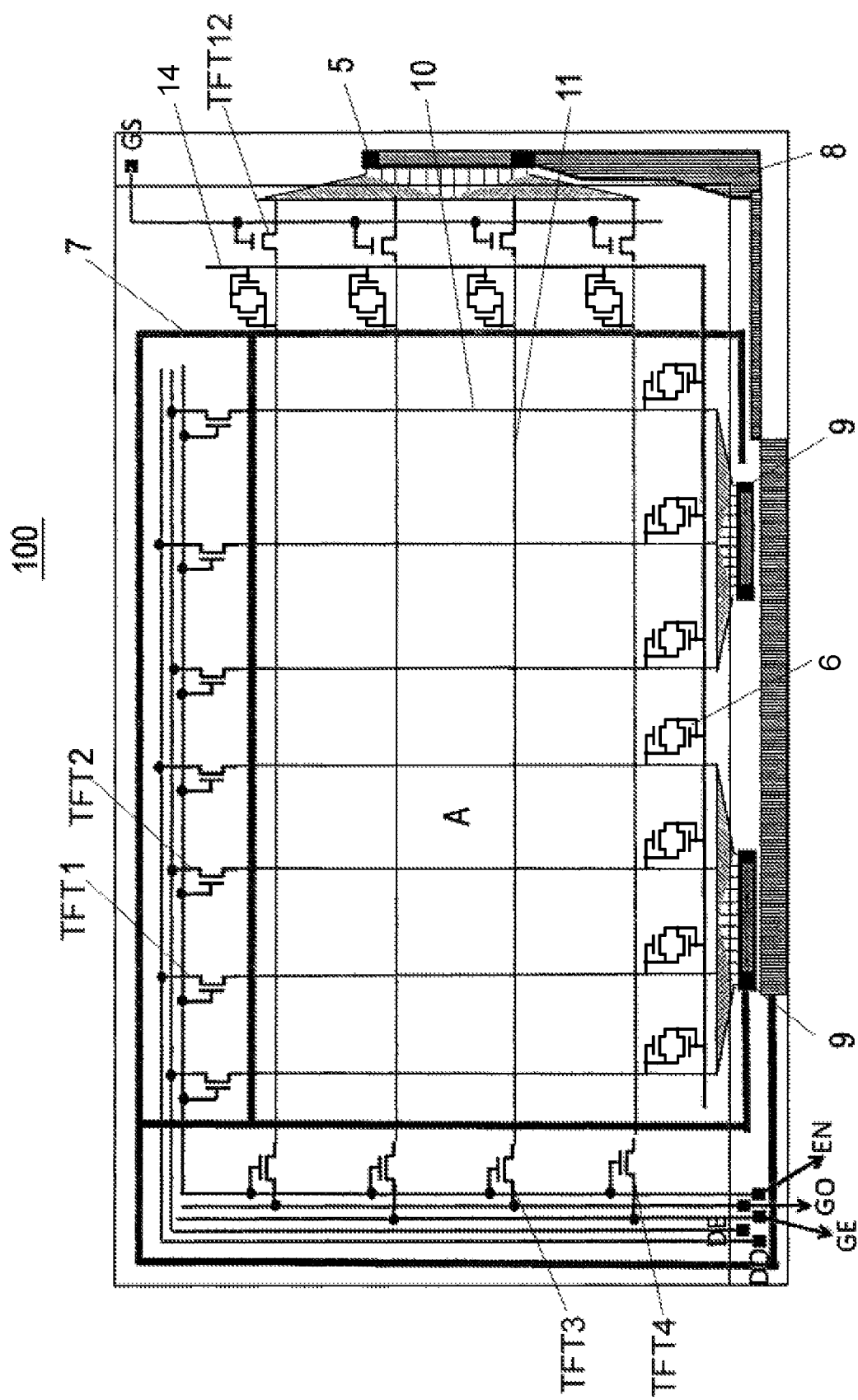
FIG. 1 shows a schematic diagram of the configuration of a display panel according to a first embodiment of the present disclosure.

FIG. 1 shows a schematic diagram of the configuration of a display panel 100 of a first embodiment of the present disclosure. As shown in FIG. 1, the display panel 100 according to the first embodiment of the present disclosure comprises a pixel area A located in the center, a peripheral wiring area external to the pixel area A (including a gate line wiring area 5 and a data line wiring area 9), a data line 10 and a gate line 11 inside the pixel area A, a short-circuit loop 14, an anti-static electricity circuit 6 for gate and data lines, and a pattern on line (PLG) 8. The data line 10 and the gate line 11 inside the pixel area A are connected with the signal lines of the data line wiring area 9 and the gate line wiring area 5 in the peripheral wiring area respectively. A common electrode wiring 7 is also arranged on the display panel 100. The short-circuit loop 14 and the anti-static electricity circuit 6 connected thereto are short-circuit patterns arranged at the margin of the pixel area of the display panel for preventing the static electricity generated in the manufacturing process of the display panel. They are irrelevant to the inventive concept of detecting short circuit/open circuit by using detection switches arranged between the pixel area and the peripheral wiring area provided by embodiments of the present disclosure, and thus not described in detail here.

In order to enable the display panel of embodiments of the present disclosure to perform switch-type detection so as to detect wiring line problems on the display panel 100, a first TFT 12, a third TFT 3 and a fourth TFT 4 are also arranged on the display panel 100 in the first embodiment of the present disclosure.

The gate of the first TFT 12 is connected with a first external connection signal line GS, the source of the first TFT 12 is connected with a signal line of the gate line wiring area, and the drain of the first TFT 12 is connected with the gate line of the pixel area. The third TFT 3 and a fourth TFT 4 are arranged on the display panel 100, and on the side opposite to the first TFT 12, the gate of the third TFT 3 is connected with an evaluation indication signal terminal EN, the source of the third TFT 3 is connected with a third external connection signal line GO, the drain of the third TFT 3 is connected with an odd-numbered row of gate line, the gate of the fourth TFT 4 is connected with the evaluation indication signal terminal EN, the source of the fourth TFT 4 is connected with a fourth external connection signal line GE, and the drain of the fourth TFT 4 is connected with an even-numbered row of gate line.

The procedure for detection applied to the display panel is in particular as follows.

Step 1: detecting whether there is a short-circuit/open-circuit defect on the display panel.

The detailed process is:
1. Applying a signal to the first external connection signal line GS to turn on the first TFT 12;
2. Applying a signal to the evaluation indication signal terminal EN to turn on the third TFT 3 and the fourth TFT 4;
3. Applying pulse signals to the third external connection signal line GO and the fourth external connection signal line GE alternately, and observing where there exists a phenomenon in which two adjacent rows of pixel units display simultaneously or whether there is a pixel unit that cannot display normally in the corresponding line to which the signal is applied.

For example, when a signal is applied to the third row of pixel units to make the third row of pixel units display, it is observed whether the fourth row of pixels display simultaneously with the third row of pixel units. If they display simultaneously, it shows that there is a short circuit between the two adjacent rows of pixels. If the two adjacent rows of pixel units display alternately at the same frequency as the third external connection signal line GO and the fourth external connection signal line GE respectively, it shows that there is no short circuit between the two adjacent rows of pixels. Alternatively, if one or more pixel units among the third row of pixel units cannot display normally when a signal is applied to the third row of pixel units to make the third row of pixel units display, it shows that there exists an open circuit.

If the open circuit is detected, a scanning detection (or an inching detection) is performed on the pixel (s) that cannot display normally to determine the precise position where the open circuit occurs and repair the circuit.

If the short circuit exists, step 2 and step 3 are performed.

Step 2: determining whether the pixel area A is short circuited or the peripheral wiring area is short circuited The detailed process is:
1. Applying a signal to the first external connection signal line GS to turn off the first TFT 12;
2. Applying a signal to the evaluation indication signal terminal EN to turn on the third TFT 3 and the fourth TFT 4;
3. Applying pulse signals to the third external connection signal line GO and the fourth external connection signal line GE alternately, at the same time, inputting data signals to make each pixel unit display the same gray, and observing whether the two adjacent rows of pixel units in which the short circuit exists in Step 1 still display simultaneously. If they display simultaneously, it shows that the short circuit exists in the pixel area, and if they no longer display simultaneously, it shows that the short circuit exists in the peripheral wiring area.

Step 3: repairing the short-circuit area. If the short circuit exists in the pixel area, the two adjacent gate lines with the short circuit occurring therein in the pixel area are scanned to determine and repair the precise short-circuit position. If the short circuit exists in the peripheral wiring area, signal lines in the peripheral wiring area corresponding to the short-circuited gate lines in the pixel area are scanned to determine and repair the precise short-circuit position.

All the TFTs described above can be N type TFT or P type TFT. If they are N type TFTs, a high level should be applied when it is required to turn on the TFTs, while a low level should be applied when it is required to turn off the TFTs. If they are P type TFTs, a low level should be applied when it is required to turn on the TFTs, while a high level should be applied when it is required to turn off the TFTs.

With the above liquid crystal panel design, it is possible to precisely and quickly detect whether there is a short-circuit or open-circuit defect and the precise position of the defect. It is only required to perform an inching detection on signal lines in a small area during the detection procedure, which saves detection time and improves detection efficiency.

As for a 1280×800 display panel of 8 inch, the high level of the external connection signal terminal GS is usually in the range of 15V to 50V and the low level is in the range of −20V to 0V. The voltage of the third external connection signal line GO and the fourth external connection signal line GE is same as the gate voltage of the display panel during operation.

Another display panel provides by an embodiment of the present disclosure comprises a pixel area and a peripheral wiring area. Detection switches are arranged between the pixel area and the peripheral wiring area, the detection switches correspond to data lines of the pixel area one to one, and the detection switches are configured to control connection and disconnection of the pixel area and the peripheral wiring area.

In particular, the detection switch comprises a second TFT, the peripheral wiring area is a data line wiring area, the gate of the second TFT is connected with a second external connection signal, the source of the second TFT is connected with a signal line of the data line wiring area, and the drain of the second TFT is connected with the data line of the pixel area.

Figure 2:
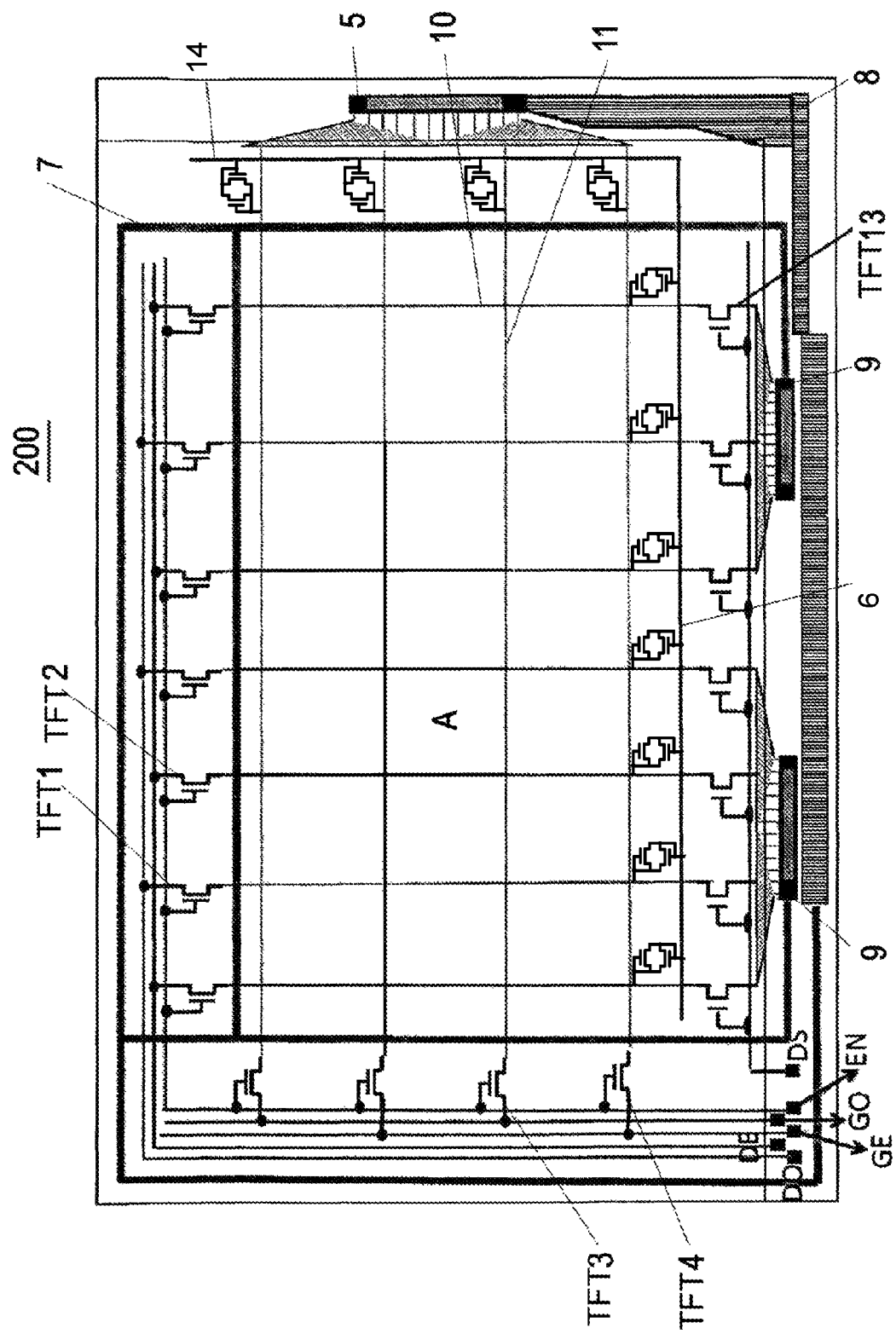
FIG. 2 shows a schematic diagram of the configuration of a display panel according to a second embodiment of the present disclosure.

FIG. 2 shows a schematic diagram of the configuration of the display panel 200 according to a second embodiment of the present disclosure.

The configuration of the display panel 200 according to the second embodiment of the present disclosure shown in FIG. 2 differs from the configuration of the display panel 100 according to the first embodiment of the present disclosure shown in FIG. 1 in that in the display panel 200, a second TFT 13 is arranged between the pixel area A and the data line wiring area 9 in the peripheral wiring area. The gate of the second TFT 13 is connected with the second external connection signal terminal DS to control the switch state of the second TFT 13 by applying a signal to the second external connection signal terminal DS. The second TFT 13 is configured to control the connection and disconnection between the data line peripheral wiring area and the pixel area.

The display panel 200 further comprises a fifth TFT 1 and a sixth TFT 2 arranged on one side of the display panel 200 opposite to the data line wiring area 9, the gate of the fifth TFT is connected with the evaluation indication signal terminal EN, the source of the fifth TFT 1 is connected with a fifth external connection signal line DO, the drain of the fifth TFT 1 is connected with an odd-numbered column of data line, the gate of the sixth TFT 2 is connected with the evaluation indication signal terminal EN, the source of the sixth TFT 2 is connected with a sixth external connection signal line DE, and the drain of the sixth TFT 2 is connected with an even-numbered column of data line.

The procedure for detection applied to the display panel is in particular as follows:

Step 1: detecting whether there is a short-circuit/open-circuit defect

The detailed process is:
1. Applying a signal to the first external connection signal line DS to turn on the second TFT 13;
2. Applying a signal to the evaluation indication signal terminal EN to turn on the fifth TFT 1 and the sixth TFT 2;
3. Applying pulse signals to the fifth external connection signal line DO and the sixth external connection signal line DE alternately, at the same time, inputting signals to the gate lines to turn on all the pixel TFTs for controlling the pixel display in each row, and observing where there exists a phenomenon in which two adjacent columns of pixel units display simultaneously or whether there is a pixel unit that cannot display normally.

For example, when a signal is applied to the third column of pixel units to make the third column of pixel units display, it is observed that whether the fourth column of pixels display simultaneously with the third column of pixel units. If they display simultaneously, it shows that there is a short circuit between the two adjacent columns of pixels. If the two adjacent columns of pixel units display alternately at the same frequency as the fifth external connection signal line DO and the sixth external connection signal line DE, it shows that there is no short circuit between the two adjacent columns of pixels. Alternatively, if one or more pixel units among the third column of pixel units cannot display normally when a signal is applied to the third column of pixel units to make the third column of pixel units display, it shows that there exists an open circuit.

If the open circuit is detected, a scanning detection (or an inching detection) is performed on the pixel (s) that cannot display normally to determine and repair the precise position where the open circuit occurs.

If the short circuit exists, step 2 and step 3 are performed.

Step 2: determining whether the pixel area A is short circuited or the peripheral wiring area is short circuited;

The detailed process is:
1. Applying a signal to the second external connection signal line DS to turn off the second TFT 13;
2. Applying a signal to the evaluation indication signal terminal EN to turn on the fifth TFT 1 and the sixth TFT 2;
3. Applying pulse signals to the fifth external connection signal line DO and the sixth external connection signal line DE alternately, and observing whether the two adjacent columns of pixel units in which the short circuit exists in Step 1 still display simultaneously. If they display simultaneously, it shows that the short circuit exists in the pixel area, and if they no longer display simultaneously, it shows that the short circuit exists in the peripheral wiring area.

Step 3: repairing the short-circuit area. If the short circuit exists in the pixel area, the two data lines with the short circuit occurring therein in the pixel area are scanned to determine and repair the specific short-circuit position. If the short circuit exists in the peripheral wiring area, signal lines in the peripheral wiring area corresponding to the short circuited data lines in the pixel area are scanned to determine and repair the specific short-circuit position.

With the above liquid crystal panel design, it is possible to precisely and quickly detect whether there is a short-circuit or open-circuit defect and the specific position where the defect occurs. It is only required to perform an inching detection on signal lines in a small area during the detection procedure, which saves detection time and improves detection efficiency.

A third display panel provides by an embodiment of the present disclosure comprises a pixel area and a peripheral wiring area. Detection switches are arranged between the pixel area and the peripheral wiring area, the detection switches correspond to gate lines and/or data lines of the pixel area one to one, and the detection switches are configured to control connection and disconnection of the pixel area and the peripheral wiring area.

In particular, the detection switch comprises a first TFT and a second TFT, and the peripheral wiring area comprises a gate line wiring area and data line wiring area; the gate of the first TFT is connected with a first external connection signal, the source of the first TFT is connected with a signal line of the gate line wiring area, and the drain of the first TFT is connected with the gate line of the pixel area; and the gate of the second TFT is connected with a second external connection signal, the source of the second TFT is connected with a signal line of the data line wiring area, and the drain of the second TFT is connected with the data line of the pixel area.

Figure 3:
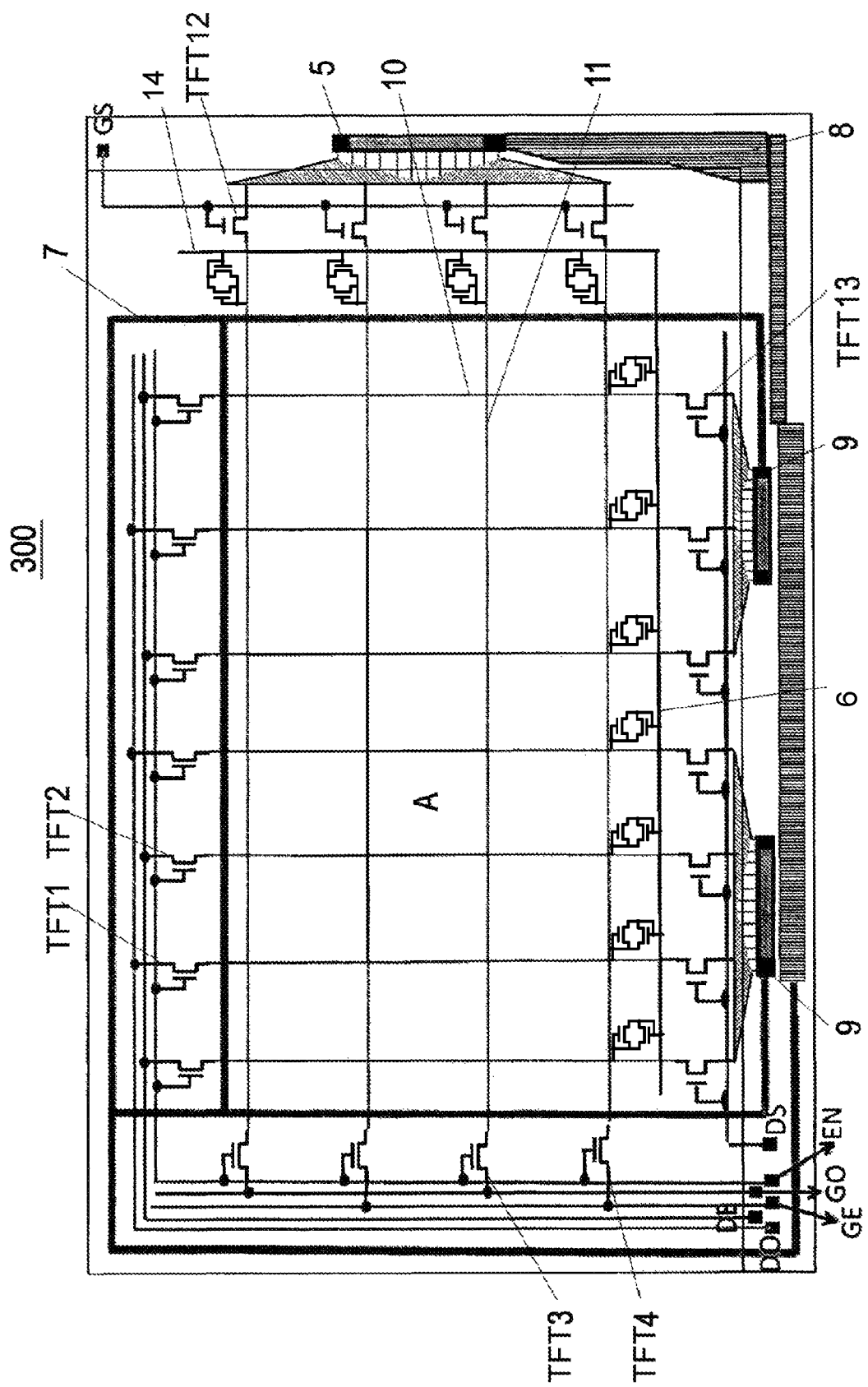
FIG. 3 shows a schematic diagram of the configuration of a display panel according to a third embodiment of the present disclosure.

FIG. 3 shows a schematic diagram of the configuration of the display panel 300 according to a third embodiment of the present disclosure.

As shown in FIG. 3, the display panel 300 comprises a first TFT 12 and a second TFT 13, the gate of the first TFT 12 is connected with a first external connection signal line GS, the source of the first TFT 12 is connected with a signal line of the gate line wiring area 5, and the drain of the first TFT 12 is connected with the gate line 11 of the pixel area; and the gate of the second TFT 13 is connected with a second external connection signal line DS, the source of the second TFT 13 is connected with a signal line of the data line wiring area 9, and the drain of the second TFT 13 is connected with the data line 10 of the pixel area.

The display panel 300 further comprises a third TFT 3 and a fourth TFT 4 arranged on one side of the display panel 300 opposite to the first TFT 12, and a fifth TFT 1 and a sixth TFT 2 arranged on one side of the display panel 300 opposite to the second TFT 13, wherein the source of the third TFT 3 is connected with the evaluation indication signal terminal EN, the source of the third TFT 3 is connected with a third external connection signal line GO, the drain of the third TFT 3 is connected with an odd-numbered row of gate line, the gate of the fourth TFT 4 is connected with the evaluation indication signal terminal EN, the gate of the fourth TFT 4 is connected with the fourth external connection signal line GE, and the drain of the fourth TFT 4 is connected with an even-numbered row of gate line, the gate of the fifth TFT 1 is connected with the evaluation indication signal terminal EN, the source of the fifth TFT is connected with the fifth external connection signal line DO, the drain of the fifth TFT 1 is connected with the odd-numbered column of data line, the gate of the sixth TFT 2 is connected with the evaluation indication signal terminal EN, the source of the sixth TFT 2 is connected with the sixth external connection signal line DE, and the drain of the sixth TFT 2 is connected with the even-numbered column of data line.

The procedure for detecting short-circuit or open-circuit defects on gate lines and data lines in the display panel is substantially the same as the procedures in the first and second embodiments, and will not be described any more.

However, during the detection, the detection orders can vary. It is possible to detect data lines first and then detect gate lines, or it is also possible to detect gate lines first and then detect data lines, which is not limited herein.

With the above liquid crystal panel design, it is possible to precisely and quickly detect whether there is a short-circuit or open-circuit defect and the precise position of the defect. It is only required to perform an inching detection on signal lines in a small area during the detection procedure, which saves detection time and improves detection efficiency.

In the above, three embodiments of the display panel of the present disclosure are illustrated. TFTs as switches for detection arranged on a side of the pixel area of the display panel close to the peripheral wiring area, such that the current for detection flows through the peripheral wiring area while flowing through the pixel area, and thus it enables to determine whether the short circuit occurs in the pixel area or the peripheral area.

Finally, it is noted that the above implementations are only for illustrating the technical solutions of embodiments of the present disclosure, and in no way limit the scope of the present disclosure. Although embodiments of the present disclosure are described in detail with reference to optional embodiments, those skilled in the art should understand that it is possible to make modifications and equivalent replacements to solutions of the embodiments of the present disclo-

What is claimed is:

1. A display panel comprising a pixel area and a peripheral wiring area, the pixel area comprises a plurality of gate lines arranged in a column direction, and the peripheral wiring area comprises a gate line wiring area, wherein each of the plurality of gate lines is connected to the gate line wiring area via each of a plurality of detection switches arranged in the column direction; wherein each of the plurality of detection switches arranged in the column direction comprises a first thin film transistor (TFT) having a gate connected with a first external connection signal, a source connected with a signal line of the gate line wiring area, and a drain connected with one of the plurality of gate lines.

2. The display panel according to claim 1, further comprising a plurality of third TFTs and a plurality of fourth TFTs arranged on one side of the display panel opposite the plurality of detection switches arranged in the column direction, wherein a gate of each of the plurality of third TFTs is connected with an evaluation indication signal terminal, a source of each of the plurality of third TFTs is connected with a third external connection signal line, a drain of each of the plurality of third TFTs is connected with an odd-numbered row of gate line; a gate of each of the plurality of fourth TFTs is connected with the evaluation indication signal terminal, a source of each of the plurality of fourth TFTs is connected with a fourth external connection signal line, and a drain of each of the plurality of fourth TFTs is connected with an even-numbered row of gate line.

3. The display panel according to claim 2, wherein the pixel area further comprises a plurality of data lines arranged in a row direction, and the peripheral wiring area further comprises a data line wiring area; wherein each of the plurality of data lines is connected to the data line wiring area via each of a plurality of detection switches arranged in the row direction, and each of the plurality of detection switches arranged in the row direction comprises a second TFT having a gate connected with a second external connection signal line, a source connected with a signal line of the data line wiring area, and a drain connected with one of the plurality of data line.

4. The display panel according to claim 3, further comprising a plurality of fifth TFTs and a plurality of sixth TFTs arranged on one side of the display panel opposite the plurality of detection switches arranged in the row direction, wherein a gate of each of the plurality of fifth TFTs is connected with an evaluation indication signal terminal, a source of each of the plurality of fifth TFTs is connected with a fifth external connection signal line, a drain of each of the plurality of fifth TFTs is connected with an odd-numbered column of data line; a gate of each of the plurality of sixth TFTs is connected with the evaluation indication signal terminal, a source of each of the plurality of sixth TFTs is connected with a sixth external connection signal line, and a drain of each of the plurality of sixth TFTs is connected with an even-numbered column of data line.

5. A display device comprising a display panel according to claim 1.

6. The display device according to claim 5, wherein the display panel further comprises a plurality of third TFTs and a plurality of fourth TFTs arranged on one side of the display panel opposite the plurality of detection switches arranged in the column direction, wherein a gate of each of the plurality of third TFTs is connected with an evaluation indication signal terminal, a source of each of the plurality of third TFTs is connected with a third external connection signal line, a drain of each of the plurality of third TFTs is connected with an odd-numbered row of gate line; a gate of each of the plurality of fourth TFTs is connected with the evaluation indication signal terminal, a source of each of the plurality of fourth TFTs is connected with a fourth external connection signal line, and a drain of each of the plurality of fourth TFTs is connected with an even-numbered row of gate line.

7. The display device according to claim 6, wherein the pixel area further comprises a plurality of data lines arranged in a row direction, and the peripheral wiring area further comprises a data line wiring area; wherein each of the plurality of data lines is connected to the data line wiring area via each of a plurality of detection switches arranged in the row direction, and each of the plurality of detection switches arranged in the row direction comprises a second TFT having a gate connected with a second external connection signal line, a source connected with a signal line of the data line wiring area, and a drain connected with one of the plurality of data lines.

8. The display device according to claim 7, wherein the display panel comprises a plurality of fifth TFTs and a plurality of sixth TFTs arranged on one side of the display panel opposite the plurality of detection switches arranged in the row direction, wherein a gate of each of the plurality of fifth TFTs is connected with an evaluation indication signal terminal, a source of each of the plurality of fifth TFTs is connected with a fifth external connection signal line, a drain of each of the plurality of fifth TFTs is connected with an odd-numbered column of data line; a gate of each of the plurality of sixth TFTs is connected with the evaluation indication signal terminal, a source of each of the plurality of sixth TFTs is connected with a sixth external connection signal line, and a drain of each of the plurality of sixth TFTs is connected with an even-numbered column of data line.

9. A display panel comprising a pixel area and a peripheral wiring area, wherein the pixel area comprises a plurality of data lines arranged in a row direction, and the peripheral wiring area comprises a data line wiring area; wherein each of the plurality of data lines is connected to the data line wiring area via each of a plurality of detection switches arranged in the row direction, and each of the plurality of detection switches arranged in the row direction comprises a second TFT having a gate connected with a second external connection signal line, a source connected with a signal line of the data line wiring area, and a drain connected with one of the plurality of data lines.

10. The display panel according to claim 9, further comprising a plurality of fifth TFTs and a plurality of sixth TFTs arranged on one side of the display panel opposite the plurality of detection switches arranged in the row direction, wherein a gate of each of the plurality of fifth TFTs is connected with an evaluation indication signal terminal, a source of each of the plurality of fifth TFTs is connected with a fifth external connection signal line, a drain of each of the plurality of fifth TFTs is connected with an odd-numbered column of data line; a gate of each of the plurality of sixth TFTs is connected with the evaluation indication signal terminal, a source of each of the plurality of sixth TFTs is connected with a sixth external connection signal line, and a drain of each of the plurality of sixth TFTs is connected with an even-numbered column of data line.

11. A display device comprising a display panel according to claim 9.

12. The display device according to claim 11, wherein the display panel further comprises a plurality of fifth TFTs and a plurality of sixth TFTs arranged on one side of the display panel opposite the plurality of detection switches arranged in the row direction, wherein a gate of each of the plurality of fifth TFTs is connected with an evaluation indication signal terminal, a source of each of the plurality of fifth TFTs is connected with a fifth external connection signal line, a drain of each of the plurality of fifth TFTs is connected with an odd-numbered column of data line; a gate of each of the plurality of sixth TFTs is connected with the evaluation indication signal terminal, a source of each of the plurality of sixth TFTs is connected with a sixth external connection signal line, and a drain of each of the plurality of sixth TFTs is connected with an even-numbered column of data line.

* * * * *